US011020760B2

(12) United States Patent
Fujino et al.

(10) Patent No.: US 11,020,760 B2
(45) Date of Patent: Jun. 1, 2021

(54) SUBSTRATE PROCESSING APPARATUS AND PRECURSOR GAS NOZZLE

(71) Applicant: HITACHI KOKUSAI ELECTRIC INC., Tokyo (JP)

(72) Inventors: Toshiki Fujino, Toyama (JP); Yuma Fujii, Toyama (JP); Kazuki Nonomura, Toyama (JP); Yoshinori Baba, Toyama (JP); Yuji Takebayashi, Toyama (JP); Kenichi Suzaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 311 days.

(21) Appl. No.: 15/432,112

(22) Filed: Feb. 14, 2017

(65) Prior Publication Data

US 2017/0232457 A1    Aug. 17, 2017

(30) Foreign Application Priority Data

Feb. 15, 2016   (JP) .............................. JP2016-025886

(51) Int. Cl.
*C23C 16/46*      (2006.01)
*B05B 7/16*       (2006.01)
(Continued)

(52) U.S. Cl.
CPC ........ *B05B 7/1693* (2013.01); *C23C 16/4401* (2013.01); *C23C 16/45578* (2013.01);
(Continued)

(58) Field of Classification Search
None
See application file for complete search history.

(56) References Cited

U.S. PATENT DOCUMENTS

2010/0218724 A1\*  9/2010  Okada ................. C23C 16/4405
                                                118/724
2013/0102161 A1    4/2013  Asai
                   (Continued)

FOREIGN PATENT DOCUMENTS

JP         06-349761 A     12/1994
JP         10-012559 A      1/1998
                   (Continued)

OTHER PUBLICATIONS

Korean Office Action dated Mar. 1, 2018 for the Korean Patent Application No. 20170020091.
(Continued)

*Primary Examiner* — David P Turocy
(74) *Attorney, Agent, or Firm* — Volpe Koenig

(57) ABSTRACT

A substrate processing apparatus includes: a process chamber accommodating substrates; a heating system for heating the process chamber to a predetermined temperature; a precursor gas supply system including a precursor gas nozzle and for supplying a precursor gas from the precursor gas nozzle to the process chamber; a reaction gas supply system configured to supply a reaction gas reacting with the precursor gas in the process chamber; and a control part configured to control the heating system, the precursor gas supply system and the reaction gas supply system to form a film on each of the plurality of substrates by performing a process, while heating the process chamber accommodating the plurality of substrates to the predetermined temperature. The process includes supplying the precursor gas from the precursor gas nozzle to the process chamber and supplying the reaction gas to the process chamber.

10 Claims, 17 Drawing Sheets

(51) Int. Cl.
*H01L 21/67* (2006.01)
*C23C 16/44* (2006.01)
*C23C 16/455* (2006.01)

(52) U.S. Cl.
CPC ........ *C23C 16/46* (2013.01); *H01L 21/67017* (2013.01); *H01L 21/67109* (2013.01); *H01L 21/67248* (2013.01)

(56) References Cited

U.S. PATENT DOCUMENTS

2014/0084389 A1  3/2014  Ogawa
2014/0357058 A1* 12/2014  Takagi ................ H01L 21/0262
                                                          438/478

FOREIGN PATENT DOCUMENTS

| JP | 2010-226092 A | 10/2010 |
| JP | 2012-023221 A | 2/2012 |
| JP | 2014-063959 A | 4/2014 |
| JP | 2014-067877 A | 4/2014 |
| JP | 2014-236129 A | 12/2014 |
| KR | 10-2010-0098337 A | 9/2010 |
| KR | 20130043574 A | 4/2013 |
| KR | 10-2014-0142160 A | 12/2014 |

OTHER PUBLICATIONS

Korean Office Action dated Dec. 27, 2018 for the Korean Patent Application No. 10-2017-0020091.
Japanese Office Action dated Jan. 23, 2019 for the Japanese Patent Application No. 2016-025886.
Chinese Office Action dated Sep. 4, 2019 for the Chinese Patent Application No. 201710076980.7.

* cited by examiner

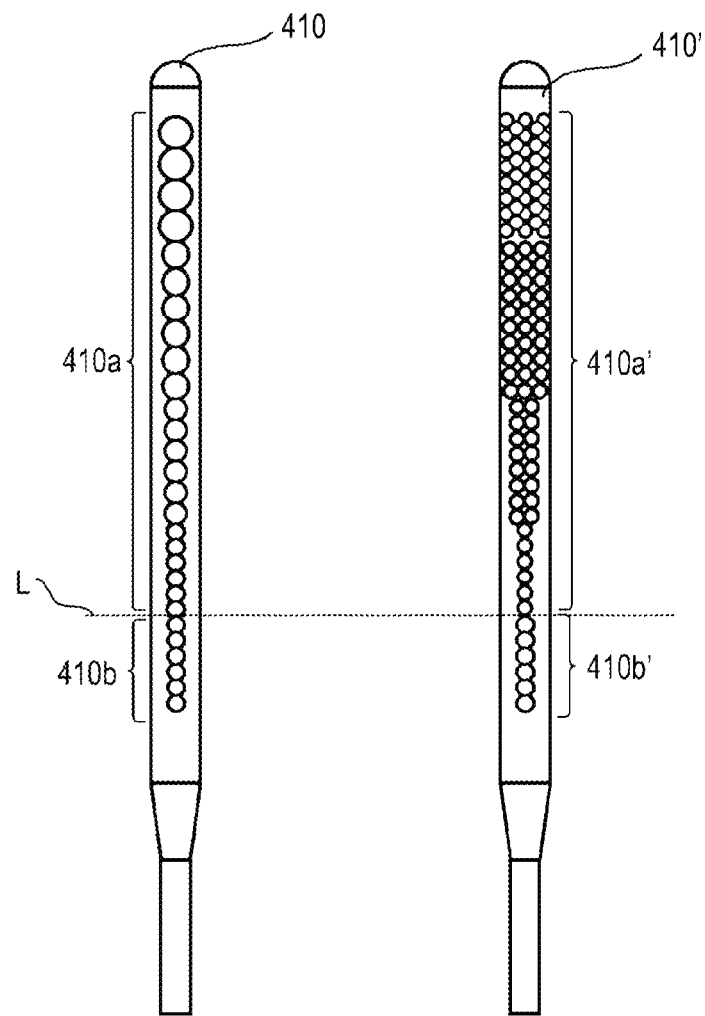

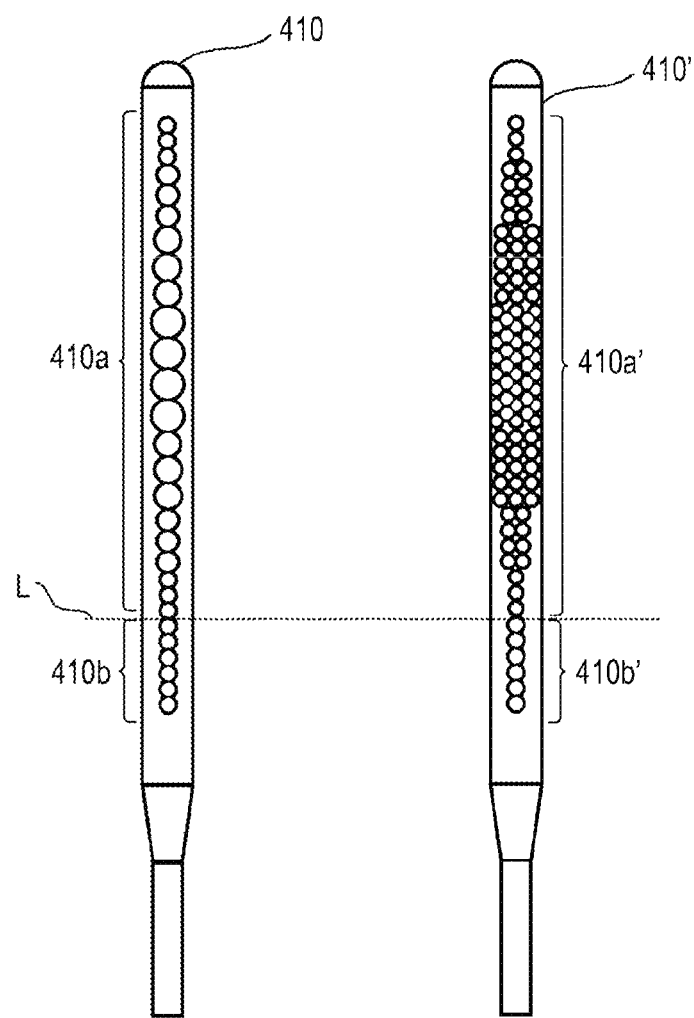

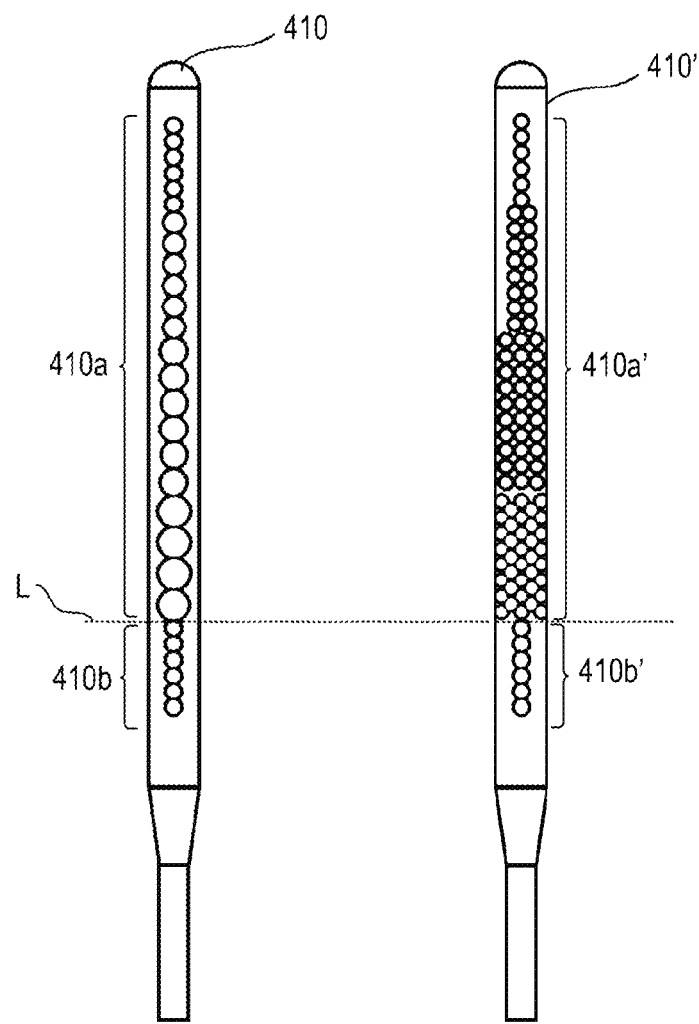

SUBSTRATE PROCESSING APPARATUS AND PRECURSOR GAS NOZZLE

CROSS-REFERENCE TO RELATED APPLICATION

This application is based upon and claims the benefit of priority from Japanese Patent Application No. 2016-025886, filed on Feb. 15, 2016, the entire contents or which are incorporated herein by reference.

TECHNICAL FIELD

The present disclosure relates to a substrate processing apparatus and a precursor gas nozzle.

BACKGROUND

As one of many processes of manufacturing a semiconductor device, a film forming process of forming a film on a substrate accommodated in a process chamber is often performed.

When such a film forming process is performed, there is a case where used gas is pyrolyzed inside a nozzle so that gas deposits adhere onto an inner wall of the nozzle. Sometimes, such gas deposits are peeled off during, the film forming process. In that case, particles (i.e., dusts) from the peeled off deposits may be supplied to the substrate accommodated in the process camber and may be ultimately introduced as an impurities into a film. Further, in a vertical type apparatus that supplies a gas using a nozzle as described above, when the gas is supplied from the nozzle into a process chamber in which a plurality of substrates are stacked, the particles may cause deterioration in inter-plane uniformity of substrates.

SUMMARY

The present disclosure provides some embodiments of a technique which is capable of uniformly supplying gas to substrates so as to enhance an inter-plane film thickness uniformity of the substrates, and suppressing gas deposits from adhering onto an inner wall of a nozzle through pyrolysis of the gas during a film forming process, thus suppressing impurities from being introduced into a film and improving a film quality and the inter plane film thickness uniformity.

According to one embodiment of the present disclosure, there is provided a substrate processing apparatus, including: a process chamber accommodating a plurality of substrates which is stacked in the processing chamber; a heating system configured to heat the process chamber to a predetermined temperature; a precursor gas supply system including a precursor gas nozzle, and configured to supply a precursor gas from the precursor gas nozzle to the process chamber, wherein the precursor gas nozzle is installed to extend along a direction in which the plurality of substrates is stacked in the process chamber, and the precursor gas nozzle has a plurality of supply holes formed at a height corresponding to the stack area of the substrates and a plurality of depressurization holes formed below the plurality of supply holes at a position where an internal temperature of the precursor gas nozzle is lower than the predetermined temperature, and wherein an internal pressure of the precursor gas nozzle is reduced through the plurality of depressurization holes; a reaction gas supply system configured to supply a reaction gas reacting with the precursor gas in the process chamber; and a control part configured to control the heating system, the precursor gas supply system and the reaction gas supply system to form a film on each of the plurality of substrates by performing a process, while heating the process chamber accommodating the plurality of substrates to the predetermined temperature, the process including; supplying the precursor gas from the precursor gas nozzle to the process chamber; and supplying the reaction gas to the process chamber.

BRIEF DESCRIPTION OF THE DRAWINGS

FIG. 15A is a view illustrating the nozzle for supplying a precursor gas in the second embodiment of the present disclosure for comparison, and FIG. 15B is a view illustrating a nozzle for supplying, a precursor gas in a tenth embodiment of the present disclosure.

FIG. 16A is a view illustrating an example of a nozzle for supplying a precursor gas in all eleventh embodiment of the present disclosure, and FIG. 16B is a view illustrating another example of the nozzle for supplying a precursor gas in the eleventh embodiment of the present disclosure.

FIG. 17A is a view illustrating an example of a nozzle for supplying a precursor gas in a twelfth embodiment of the present disclosure, and FIG. 17B is a view illustrating another example of the nozzle supplying a precursor gas in the twelfth embodiment of the present disclosure.

DETAILED DESCRIPTION

Figure 1:
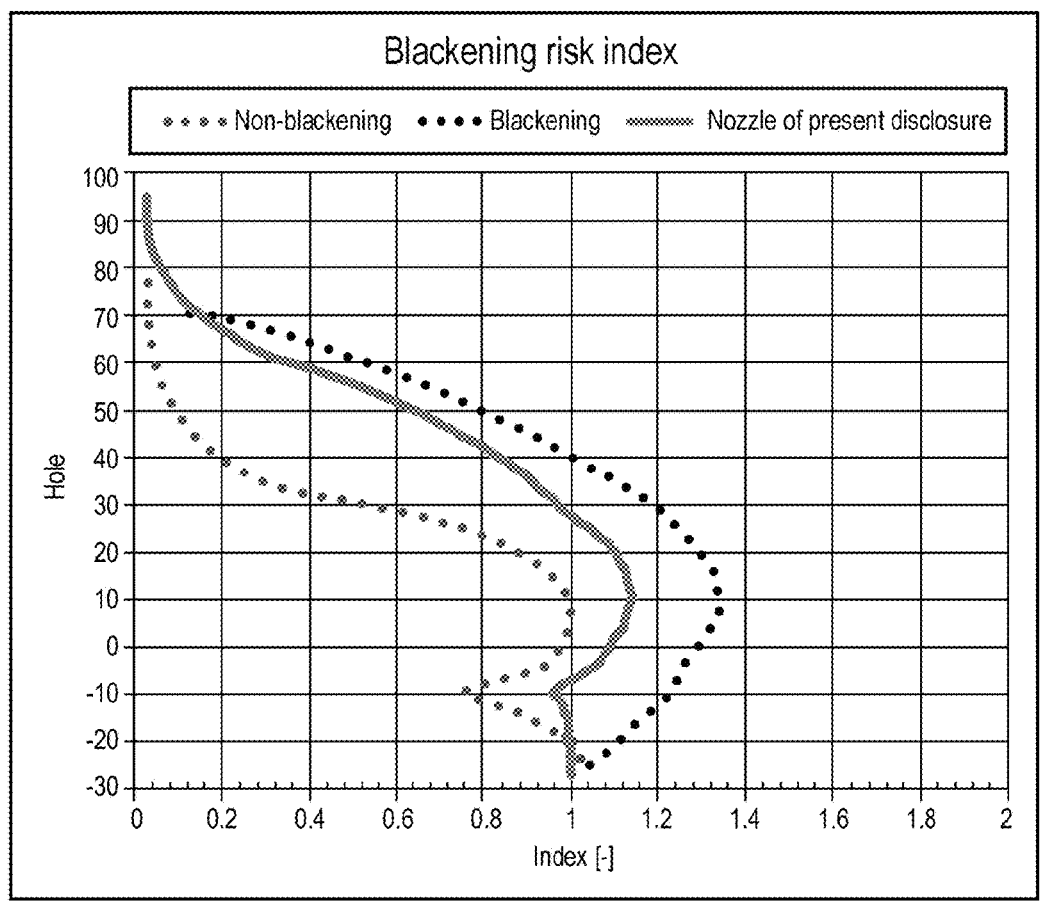
FIG. 1 is a view illustrating a blackening risk index according to the present disclosure.

When a film forming process is performed, there is a case where the gas used in the previous film forming process is pyrolyzed inside a nozzle and its deposits adhere onto an inner wall of a nozzle. Such deposits may be peeled off during a next film forming cycle. Once the gas deposits are peeled off during the next film forming process, particles (i.e., dusts) of the gas deposits are supplied to substrates accommodated in a process camber and may be ultimately introduced as impurities into a film. As such, there is a need of a scheme preventing the gas deposits from adhering onto the inner wall of the nozzle (scheme against a dust source generated inside the nozzle).

During the film forming process, the interior of the process chamber is set at a high temperature to increase the reactivity of the gas, which prompts the self-decomposition of the gas even in the nozzle so that the gas deposits are prone to adhere onto the inner wall of the nozzle. In addition, in the case of a porous nozzle with a plurality of holes formed therein, an upstream side a lower portion) of the nozzle has higher pressure. Thus, the self-decomposition of the gas is more likely to occur. Furthermore, in many cases, the upstream side of the nozzle is positioned near the boundary of a soaking field (soaking area) of a heater configured to heat the process chamber. Therefore, it is considered that the upstream side of the nozzle undergoes a rapid temperature change. Thus, it is considered that the self-decomposition of the gas occurs in the lower portion of the nozzle (for example, a portion below a product substrate) due to the high pressure and the rapid temperature change, which causes the adhesion of the gas deposits onto the inner wall of the nozzle, thereby blackening the inner wall of the nozzle.

The present inventors have conducted intensive studies and found that factors such as the internal temperature and the internal pressure of the nozzle are related to the cause of the gas deposits adhering onto the inner wall of the nozzle. If the temperature is lowered and if an amount of the gas is reduced, the gas deposits do not adhere onto the inner wall of the nozzle. Thus, it was devised that a depressurization hole (a pressure-reducing hole or a depressurizing hole) is formed in a portion onto which the gas deposits are adhered (for example, the lower portion of the nozzle, near the boundary of the soaking field of the heater, or the portion below the product substrate) to reduce the internal pressure of the nozzle, thereby suppressing the pyrolysis of the gas inside the nozzle. That is to say, a precursor gas nozzle is installed inside the process chamber. The precursor gas nozzle has a plurality of supply holes (first precursor gas supply holes) formed at a height corresponding to a region where substrates are stacked (at a position where the substrate is located), and a plurality of depressurization holes (second precursor gas supply holes) formed below the plurality of supply holes at a position where an internal temperature of the precursor gas nozzle is lower than a predetermined temperature. This makes it possible to suppress the generation of the gas deposits, which is considered as the cause of blackening the inner wall of the nozzle.

In addition, as illustrated in FIG. 1, a blackening risk is indexed by representing the product of the internal temperature, pressure, and gas density of the nozzle as a ratio, and a balance (a ratio of total aperture area values, a flow rate balance or the like) between the supply holes through which gas is supplied to the substrate (the first precursor gas supply holes) and the depressurization holes (the second precursor gas supply holes) is optimized to fall within a non-blackening range. That is to say, each of the total aperture area values and a ratio between a total aperture area of the plurality of supply holes (the first precursor gas supply holes) and a total aperture area of the plurality of depressurization holes (the second precursor gas supply holes) are optimized to have a set total aperture area such that the product of the internal temperature, the internal pressure, and the gas density of the precursor gas nozzle corresponds to a value at which the gas deposits generated as the precursor gas is autolyzed do not adhere inside the precursor gas supply nozzle (or a value with which the precursor gas is not autolyzed). In parameters such as the internal temperature, the internal pressure and the internal gas density, the internal temperature and the internal pressure are more influential than the internal gas density. In a vertical type apparatus that supplies a gas using the nozzle as described above, the gas including particles of the gas deposits is supplied from the nozzle to a process chamber in which a plurality of substrates is stacked, and such gas may cause the deterioration in an inter-plane uniformity of substrates. However, an embodiment of this application provides a vertical type apparatus that can suppress the adhesion of the gas deposits onto an inner wall of the nozzle and also secure an inter-plane film thickness uniformity of films formed on the stacked substrates. For example, by changing the diameter of the number of the holes at each height of the nozzle and balancing a non-blackening nozzle value (indicated by a light-colored dotted line) and a blackening nozzle value (indicated by a dark-colored dotted line) as shown in FIG. 1, it is possible to optimize a ratio between the total aperture areas of the supply holes and the depressurization holes. As mentioned above, according to the present disclosure, it is possible to enhance a film quality and in-plane film thickness uniformity of substrates while enhancing an inter-plane film thickness uniformity of substrates.

First Embodiment

(1) Configuration of Substrate Processing Apparatus

Figure 2:
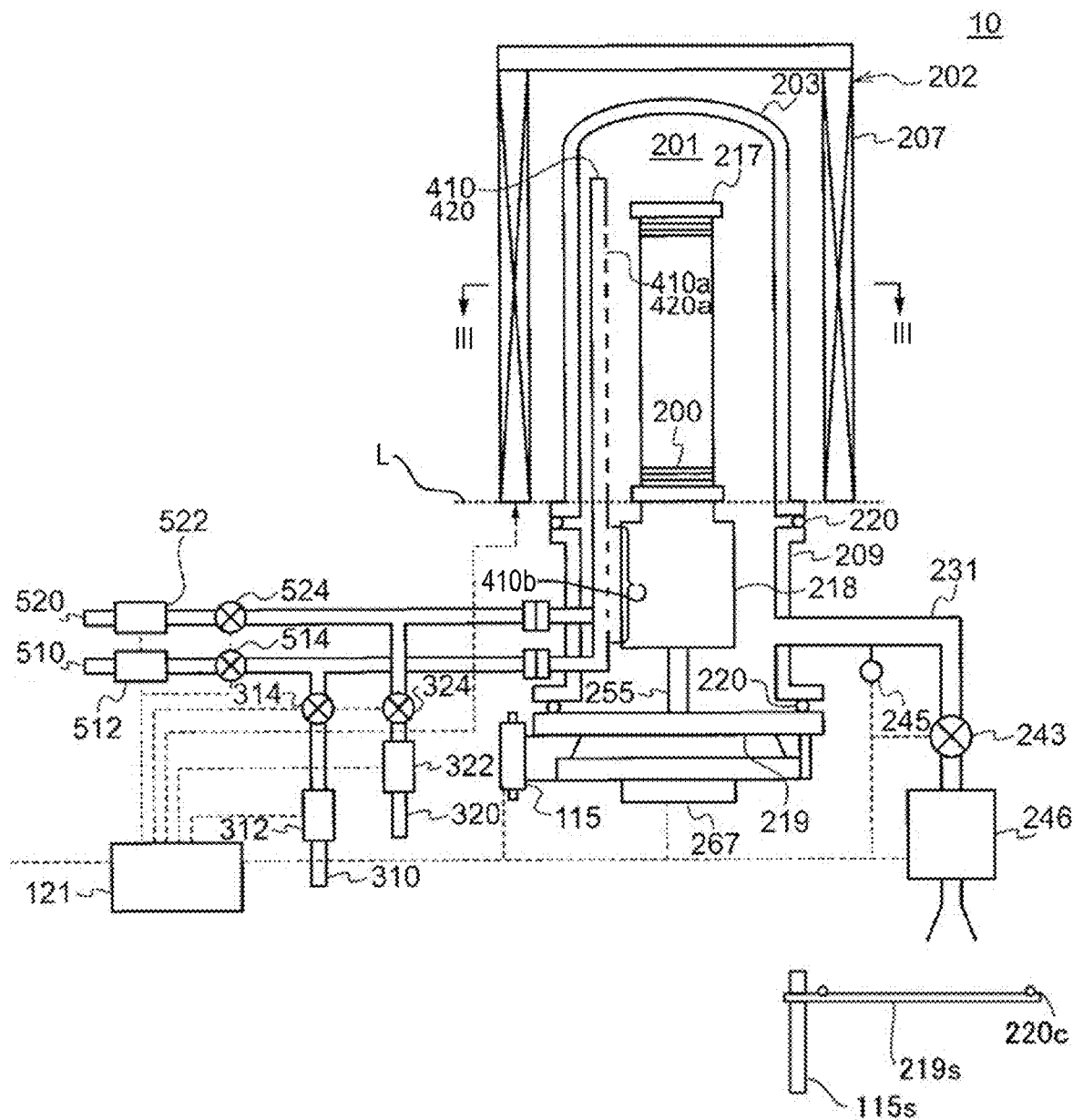
FIG. 2 is a schematic configuration view of a vertical type processing furnace of a substrate processing apparatus suitably used in a first embodiment of the present disclosure, in which a portion of the processing furnace is shown in a vertical cross sectional view.

As illustrated in FIG. 2, a processing furnace 202 includes a heater 207 as a heating system (temperature adjustment part). The heater 207 has a cylindrical shape and is supported by a heater base (not shown) serving as a holding plate so as to be vertically installed. The heater 207 is configured to heat a process chamber 201 which will be described later, to a predetermined temperature. The heater 207 also functions as an activation mechanism (an excitation part) configured to thermally activate (excite) a gas.

A reaction tube 203 is disposed inside the heater 207 in a concentric relationship with the heater 207. The reaction tube 203 is made of a heat resistant material such as, e.g., quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal such as, e.g., stainless steel (SUS) or the like and has a cylindrical shape with its upper and lower ends opened. An upper end portion of the manifold 209 is configured to engage with a lower end portion of the reaction tube 203 such that the manifold 209 supports the reaction tube 203. An O-ring 220 as a seal member is installed between the manifold 209 and the reaction tube 203. The manifold 209 is supported by the heater base so that the reaction tube 203 is in a vertically-installed state. A process vessel (reaction vessel) is mainly configured by the combination of the reaction tube 203 and the manifold 209. A process chamber 201 is formed in a hollow cylindrical portion of the process vessel. The process chamber 201 is Configured to accommodate a plurality of wafers 200 as substrates in such a state that they are vertically stacked in a horizontal posture in multiple stages inside a boat 217 (to be described later).

Nozzles 410 and 420 are installed inside the process chamber 201 so as to penetrate through a sidewall of the manifold 209. Gas supply pipes 310 to 320 as gas supply lines are respectively connected to the nozzles 410 and 420. In this way, two nozzles 410 and 420 and two gas supply pipes 310 and 320 are connected to the process vessel (the manifold 209) such that plural types of gases are supplied into the process chamber 201.

Mass flow controllers (MFCs) 312 and 322, which are flow rate controllers (flow rate control parts), and valves 314 and 324, which are opening/closing valves, are respectively installed in the gas supply pipes 310 and 320 sequentially from respective upstream sides. Gas supply pipes 510 and 520 as gas supply lines, which respectively supply an inert gas, are respectively connected to the gas supply pipes 310 and 320 at downstream sides of the valves 314 and 324. MFCs 512 and 522, which are flow rate controllers (flow rate control parts and valves 514 and 524, which are opening/closing valves, are respectively installed in the gas supply pipes 510 and 520 sequentially from respective upstream sides.

Figure 3:
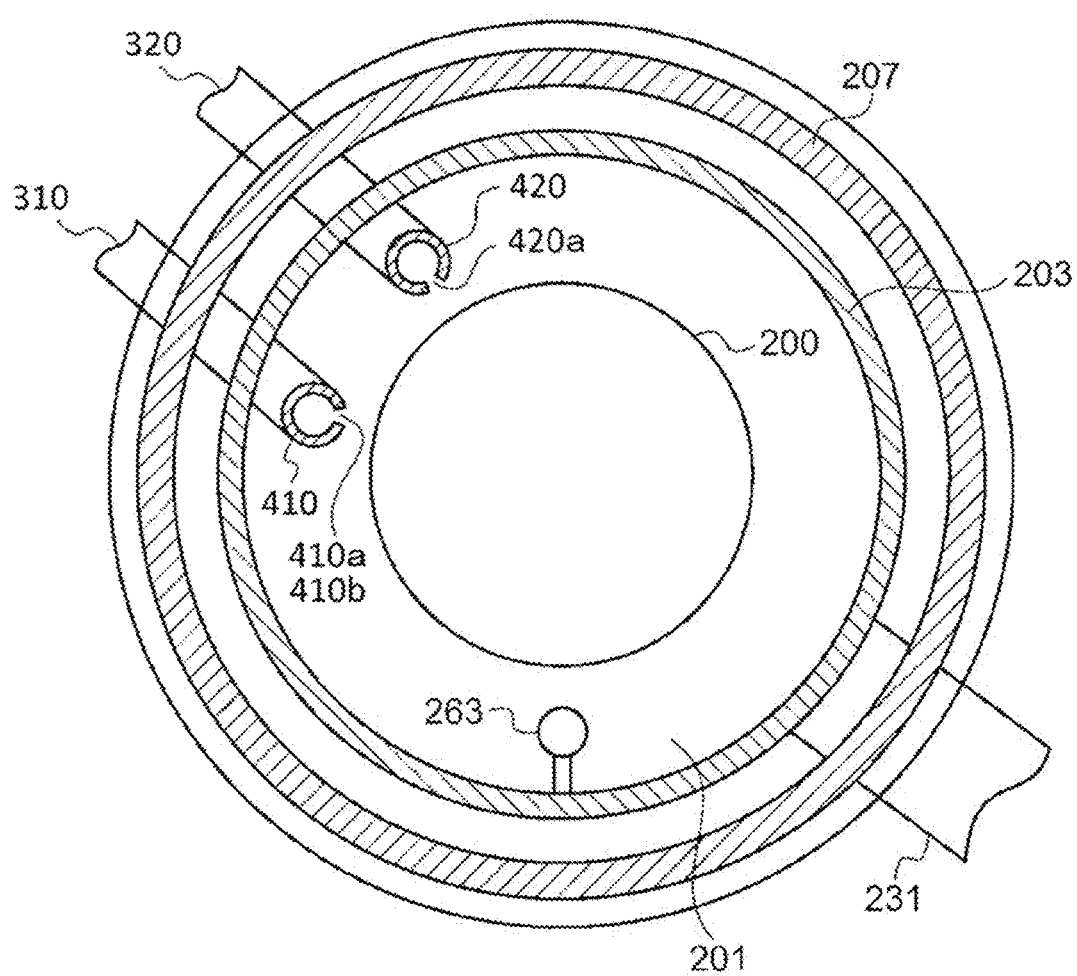
FIG. 3 is a schematic configuration view of the vertical type processing furnace of the substrate processing apparatus suitably used in the first embodiment of the present disclosure, in winch a portion of the processing furnace is shown in a cross sectional view taken along line III-III in FIG. 2.

The nozzles 410 and 420 are respectively connected to front end portions of the gas supply pipes 310 and 320. As illustrated in FIGS. 2 and 3, the nozzles 410 and 420 are disposed in a space of an annular shape (when viewed from the top) between an inner wall of the reaction tube 203 and the wafers 200 such that the nozzles 410 and 420 are respectively installed to extend upward along a stack direction of the wafers 200 from a lower portion of the inner wall of the reaction tube 203 to an upper portion thereof. Specifically, the nozzles 410 and 420 are respectively installed at a lateral side of a wafer arrangement region in which the wafers 200 are arranged, namely in a region which horizontally surrounds the wafer arrangement region, so as to extend along the wafer arrangement region. That is to say, the nozzles 410 and 420 are respectively installed in a perpendicular relationship with the surfaces (flat surfaces) of the wafers 200 at lateral sides of end portions (peripheral portions) of the wafers 200 which are carried into the process chamber 201. Each of the nozzles 410 and 420 is configured as an shaped long nozzle. A horizontal portion of each of the nozzles 410 and 420 is installed to penetrate through the sidewall of the manifold 209. A vertical portion of each of the nozzles 410 and 420 is installed to extend upward at least from one end side of the wafer arrangement region toward the other end side thereof.

A plurality of supply holes 410a (first gas supply holes or first precursor gas supply holes) and 420a (second gas supply holes) through which gas is supplied, are respectively formed at heights corresponding to the wafers 200 heights corresponding to areas where substrates (the wafers 200) are stacked) in lateral surfaces of the nozzles 410 and 420. The first and second gas supply holes 410a and 420a are opened toward the center of the reaction tube 203 such that gas is supplied toward the wafers 200 through the respective holes. The first and second gas supply holes 410a and 420a are formed at plural locations in a region in which the wafers 200 are located inside the reaction tube 203, namely in a position facing the boat 217 as a substrate support mechanism, specifically, between a lower end portion of the heater 207 and a upper portion thereof.

Depressurization holes 410b (pressure-reducing holes or second precursor gas supply holes) through which an internal pressure of the nozzle are reduced, are formed below the supply holes 410a of the nozzle 410, for example, in a position which faces a heat insulating plate (not shown) or a heat insulating tube 218 which will be described later. The position of the depressurization holes 410b is below the boat 217, and the depressurization holes 410b are positioned approximately below a broken line L which corresponds to a lower end of the heater 207. The broken line L corresponds to a portion (boundary of soaking field) that is initially affected by the heat generated from the heater 207. For example, in a case of heating the heater 207 up to a temperature of 550 degrees C., the broken line L is near a position at which the temperature starts to rise to about 350 to 550 degrees C. The internal temperature of the nozzle 410 is lowered as it goes downward from the broken line L. Ultimately, the temperature is decreased to a temperature lower than a predetermined temperature at which gas is autolyzed (outside of the soaking region). The temperature of a position higher than that of the lower end of the heater 207, namely above the position of the boat 217, is set at, e.g., 550 degrees C. (within the soaking region). The aperture area of the depressurization holes 410b is configured to be greater than that of the supply holes 410a. Although FIG. 2 illustrates an example in which five depressurization holes 410b are formed, the holes may be added or reduced. A single depressurization hole may be used as long as it has the required aperture area. In addition, the depressurization hole may have rounded shape, an elliptical shape, or a slit shape.

Figure 4:
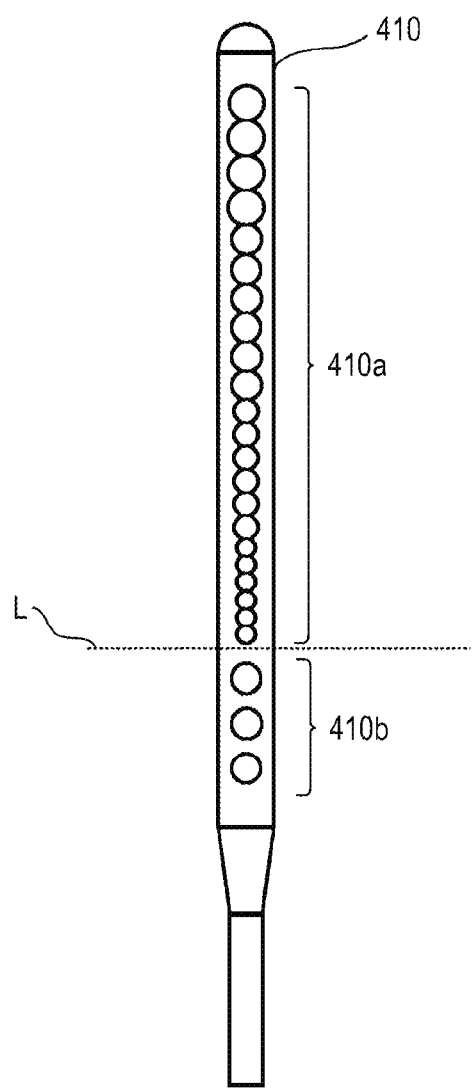
FIG. 4 is a view illustrating a nozzle for supplying a precursor gas in the first embodiment of the present disclosure.

FIG. 4 illustrates a first embodiment of the nozzle 410. The supply holes 410a are formed near the upper side of the broken line L which corresponds to the lower ends of the boat 217 and the heater 207. A hole diameter (aperture area) of the supply holes 410a is set to be gradually increased from the upstream side of the nozzle 410 toward the downstream side thereof. This makes it possible to further uniformize the flow rate of a gas supplied through the supply holes 410a. A plurality of (three in FIG. 4) depressurization holes 410b is formed below the supply hole 410a to have a hole diameter that provides an aperture area greater than that of the adjacent supply holes 410a. The plurality of depressurization holes 410b has the same aperture area.

Based on the indexed blackening risk illustrated in FIG. 1, the aperture area of the supply holes 410a and the depressurization holes 410b, namely the hole diameters and the number of the respective holes are optimized and formed such that the balance (a ratio of the total aperture area values, a flow rate balance or the like) between the supply holes and the depressurization holes falls within a range in which the inner wall of the nozzle 410 is not blackened, in consideration of the internal temperature and the internal pressure of the nozzle 410, specifically the gas density in addition to the internal temperature and the internal pressure.

The supply holes 420a formed in the nozzle 420 may be formed at multiple locations between the lower portion of the reaction tube 203 and the upper portion thereof. The supply holes 420a have the same aperture area and are formed at the same aperture pitch, respectively. However, the supply holes 420a are not limited to the aforementioned forms. For example, the aperture area of the gas supply holes 420a may be set to become gradually larger from a lower portion (upstream side) toward an upper portion (downstream side) thereof. This makes it possible to further uniformize flow rates of the gas supplied through the supply holes 420a.

As described above, in the present embodiment, the gas is transferred through the nozzles 410 and 420, which are disposed in a vertically-elongated space with an annular plan-view shape, i.e., a cylindrical space, defined by the inner wall of the sidewall of the reaction tube 203 and the end portions (peripheral portions) of the wafers 200 arranged within the reaction tube 203. The gas is injected into the reaction tube 203 in the vicinity of the wafers 200, through the supply holes 410a and 420a respectively formed in the nozzles 410 and 420. Accordingly, the gas supplied into the reaction tube 203 mainly flows inside the reaction tube 203 in a direction parallel to surfaces of the wafers 200, i.e., in a horizontal direction. The gas is supplied into the process chamber 201 below the region where the wafers 200 are arranged, through the depressurization holes 410b. The depressurization holes 410b reduce the internal pressure of the nozzle 410.

With this configuration, it is possible to uniformly supply the gas to the respective wafers 200, thus enhancing the inter-plane film thickness uniformity of films formed on the respective wafers 200. Further, it is possible to suppress the self-decomposition of the gas within the nozzle, thus suppressing the amount of the adhesion of the gas deposits onto the inner wall of the respective nozzle. This also suppresses a problem that such deposits are peeled off during a film forming process and particles of the peeled off deposits are introduced as an impurity into a film. Thus, it is possible to enhance the film quality. The gas flowing on the surfaces of the wafers 200, namely the residual gas after the reaction, flows toward an exhaust port, i.e., the exhaust pipe 231 which will be described later. The flow direction of the residual gas is not limited to a vertical direction but may be appropriately decided depending on a position of the exhaust port.

A process gas (precursor gas) is supplied from the gas supply pipe 310 into the process chamber 201 via the MFC 312, the valve 314 and the nozzle 410. As the precursor gas, it may be possible to use, for example, a trimethylaluminum (Al(CH$_3$)$_3$, abbreviation: TMA), which is an aluminum (Al)-containing precursor (an Al-containing precursor gas or an Al-containing gas) that is a metal-containing gas containing aluminum (Al) as a metal element. The TMA is an organic-based precursor and is alkylaluminum in which an alkyl group as a ligand is bonded to Al. In the case where the precursor gas is supplied from the nozzle 410, the nozzle 410 may be referred to as a precursor as nozzle.

The precursor gas refers to a gaseous precursor, for example, a gas precursor which remains in a gas state under room temperature and atmospheric pressure, or a gaseous precursor, for example, a gas obtained by vaporizing a liquid precursor which remains in a liquid state under room temperature and atmospheric pressure. When the term "precursor" is used herein, it may refer to "a precursor staying in a liquid state," "a precursor (precursor gas) staying in a gaseous state," or both.

A process gas (reaction gas), for example, an oxygen (O)-containing gas (an oxidizing gas or an oxidizing agent) as a reaction gas (reactant), which contains O and reacts with Al, is supplied from the gas supply pipe 320 into the process chamber 201 through the MFC 322, the valve 324 and the nozzle 420. As the O-containing gas, it may be possible to use, for example, an ozone (O$_3$) gas.

An inert gas, for example, a nitrogen (N$_2$) gas, is supplied from the gas supply pipes 510 and 520 into the process chamber 201 through the MFCs 512 and 522, the valves 514 and 524, the gas supply pipes 310 and 320 and the nozzles 410 and 420.

In the case where the precursor gas which is autolyzed at a predetermined temperature, is supplied from the gas supply pipe 310, a precursor gas supply system is mainly configured by the combination of the gas supply pipe 310, the MFC 312 and the valve 314. The nozzle 410 may be regarded as being included in the precursor gas supply system. The precursor gas supply system may be referred to as a precursor supply system. In the case where the metal-containing gas is supplied from the gas supply pipe 310, the precursor gas supply system may be referred to as a metal-containing gas supply system. In the case where the Al-containing precursor (the Al-containing precursor gas or the Al-containing gas) is used as the metal-containing gas, the metal-containing gas supply system may be referred to as an Al-containing precursor (an Al-containing precursor gas or an Al-containing gas) supply system. In the case where TMA is used as the Al-containing gas, the Al-containing precursor supply system may be referred to as a TMA supply system.

In the case where the reaction gas (reactant) is supplied from the gas supply pipe 320, a reaction gas supply system (reactant supply system) is mainly configured by the combination of the gas supply pipe 320, the MFC 322 and the valve 324. The nozzle 420 may be regarded as being included in the reaction gas supply system. In the case where the O-containing gas (the oxidizing gas or the oxidizing agent) is supplied as the reaction gas, the reaction gas supply system may be referred to as an O-containing gas (an oxidizing gas or an oxidizing agent) supply system. In the case where O$_3$ is supplied as the O-containing gas, the O-containing gas supply system may be referred to as an O$_3$ supply system. In the case where the reaction gas is supplied from the nozzle 420, the nozzle 420 may be referred to as a reaction gas nozzle.

An inert gas supply system is mainly configured by the combination of the gas supply pipes 510 and 520, the MFCs 512 and 522 and the valves 514 and 524.

The combination of the precursor gas supply system and the reaction gas supply system may be referred to as a gas supply system. The inert gas supply system may be regarded as being included in the gas supply system.

The exhaust pipe 231 as an exhaust flow path through which the internal atmosphere of the process chamber 201 is exhausted, is installed in the reaction tube 203. A vacuum pump 246 as a vacuum exhaust device is connected to the exhaust pipe 231 via a pressure sensor 245 as a pressure detector (pressure detection part) configured to detect the internal pressure of the process chamber 201 and an auto pressure controller (APC) valve 243 as an exhaust valve (pressure regulation part). The APC valve 243 is a valve configured to start and stop the vacuum-exhaust of the interior of the process chamber 201 by opening and closing the valve while operating the vacuum pump 246. Further, the APC valve 243 is a valve configured to regulate the internal pressure of the process chamber 201 by adjusting an opening degree of the valve based on the pressure information d elected by the pressure sensor 245 while operating the vacuum pump 246. An exhaust system is mainly configured by the combination of the exhaust pipe 231, the APC valve 243 and the pressure sensor 245. The vacuum pump 246 may be regarded as being included in the exhaust system. The exhaust pipe 231 is not limited to being installed in the reaction tube 203 but may be installed in the manifold 209 just like the nozzles 410 and 420.

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel or the like, and is formed in a disc shape. An O-ring 220, which is a seal member making contact with the lower end portion of the manifold 209, is installed on an upper surface of the seal cap 219. A rotation mechanism 267 configured to rotate the boat 217 (to be described later) is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. Furthermore, a shutter 219s as a furnace opening cover capable of hermetically sealing the lower end opening of the manifold 209 while moving the seal cap 219 down with the boat elevator 115 is installed under the manifold 209. The shutter 219s is made of metal such as, e.g., stainless steel or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of, e.g., 25 to 200, wafers 200, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates (not shown) made of a heat resistant material such as quartz or SiC are installed below the boat 217 in multiple stages. With this configuration, it is difficult for the heat generated from the heater 207 to be radiated to the seal cap 219. However, the present embodiment is not limited to such an aspect. For example, instead of installing the heat insulating plates below the boat 217, a heat insulating tube 218 as a tubular member made of a heat resistant material such as quartz or SiC may be installed under the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 410 and 420, the temperature sensor 263 is formed in an L shape. The temperature sensor 263 is installed along the inner wall of the reaction tube 203.

Figure 5:
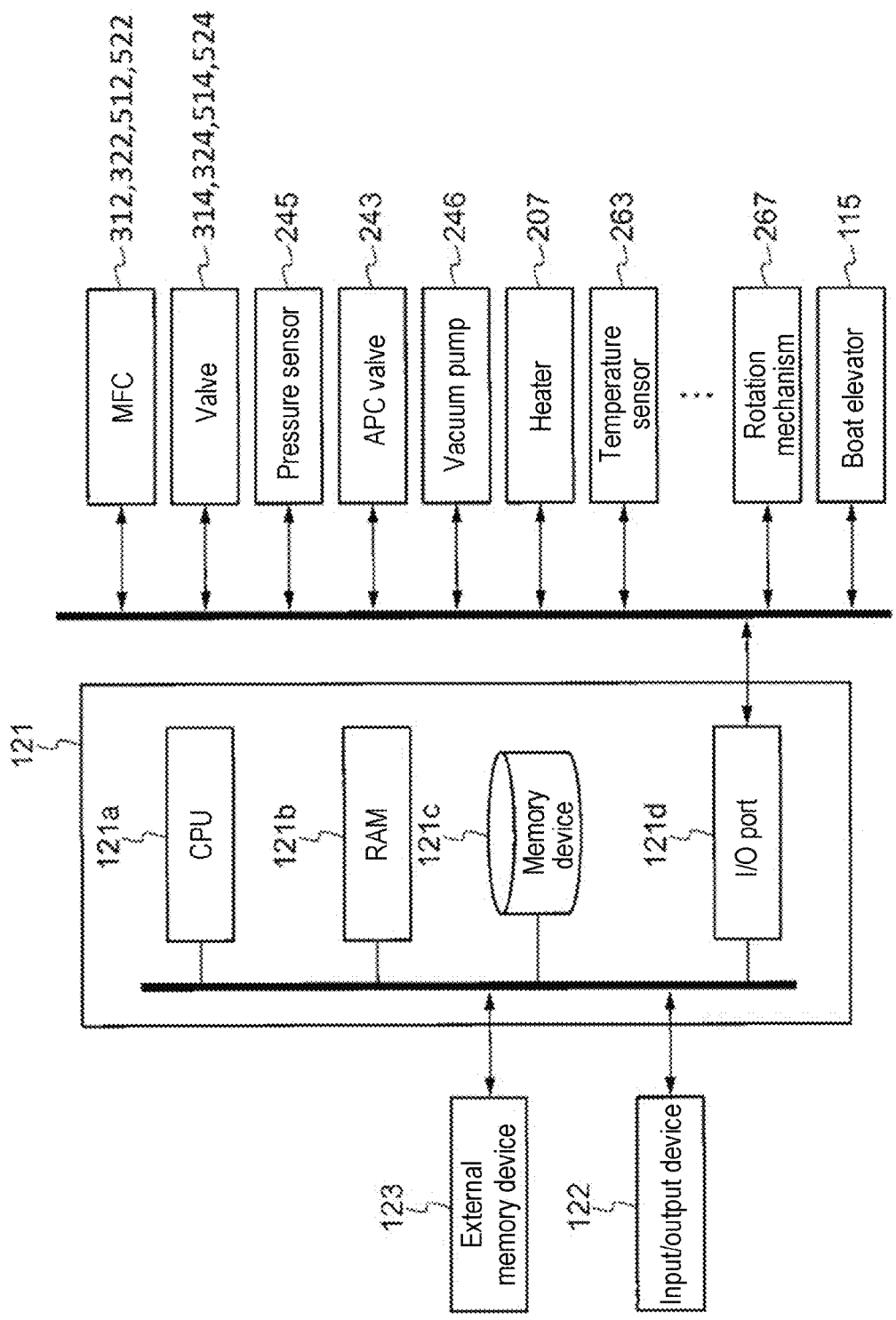
FIG. 5 is a schematic configuration view of a controller of the substrate processing apparatus suitably used in the first embodiment of the present disclosure, in which a control system of the controller is shown in a block diagram.

As illustrated in FIG. 5, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 composed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of a substrate process to be described later), a cleaning recipe for specifying sequences and conditions of a cleaning process (to be described later) or the like is readably stored in the memory device 121c. The process recipe functions as a program for causing the controller 121 to execute each sequence in the film forming process (to be described later) to, obtain a predetermined result. The cleaning recipe functions as a program for causing the controller 121 to execute each sequence in the cleaning process (to be described later) to obtain a predetermined result. Hereinafter, the process recipe, the cleaning recipe, the control program and the like will be generally and simply referred to as a "program". Furthermore, the process recipe and the cleaning recipe will be simply referred to as a "recipe". When the term "program" is used herein, it may indicate a case of including only the process recipe, a case of including only the cleaning recipe, a case of including only the control program, or a case of including any combination of them. The RAM 121b is configured as a memory area (work area) in which a program or data read by the CPU 121a is temporarily stored.

The I/O port 121d is connected to the MFCs 512, 522, 312 and 322, the valves 514, 524, 314 and 324, the pressure sensor 245, the APC valve 243, the vacuum pump 246, the temperature sensor 263, the heater 207, the rotation mechanism 267, the boat elevator 115, the shutter opening/closing mechanism 115s, and the like.

The CPU 121a is configured to read and execute the control program from the memory device 121c. Further, the CPU 121a is configured to read the recipe from the memory device 121c according to an operation command inputted from the input/output device 122. In addition, the CPU 121a is configured to control, according to the contents of the recipe thus read, the flow rate adjusting operation of various kinds of gases performed by the MFCs 512, 522, 312 and 322, the opening/closing operation of the valves 514, 524, 314 and 324, the opening/closing operation of the APC valve 2434, the pressure regulating operation performed by the APC valve 243 based on the pressure sensor 245, the driving and stopping operation of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123 (for example, a magnetic tape, a magnetic disk such as a flexible disk or a hard disk, an optical disc such as a CD or DVD, a magneto-optical disc such as an MO, a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be provided on the computer using a communication means such as the Internet or a dedicated line, instead of using the external memory device 123.

(2) Film Forming Process

Figure 6:
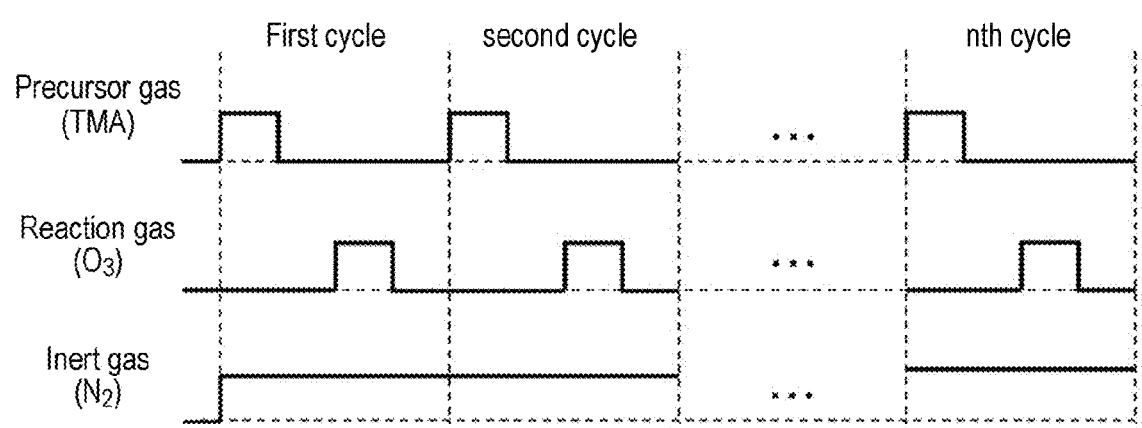
FIG. 6 is a view illustrating a film forming sequence according to the first embodiment of the present disclosure.

A sequence example of forming a film on a substrate using the aforementioned substrate processing apparatus 10, which is one of processes for manufacturing a semiconductor device, will be described with reference to FIG. 6. In the following descriptions, the operations of the respective parts constituting the substrate processing apparatus are controlled by the controller 121.

In the present embodiment, an aluminum oxide film (AlO film) as a film containing Al and O is formed on each of a plurality of wafers 200 by heating the process chamber 201 in which the plurality of wafers 200 as substrates are accommodated in a stacked state, at a predetermined temperature, and performing a predetermined number of times (n times) a step of supplying a TMA gas as a precursor gas from the supply holes 410a and the depressurization holes 410b formed in the nozzle 410 to the process chamber 201 and a step of supplying an O3 gas as a reaction gas from the supply holes 420a formed in the nozzle 420 to the process chamber 201.

When the term "wafer" is used herein, it may refer to "a wafer itself" or "a laminated body (aggregate) of a wafer and a predetermined layer or film formed on the surface of the wafer" (i.e., a wafer including a predetermined layer or film formed on its surface may be referred to as a wafer). In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, in the present disclosure, the "wafer" is an example of the "substrate". Hereinafter, a method of manufacturing a semiconductor device according to the present embodiment will be described in detail.

(Wafer Charging and Boat Loading)

If the plurality of wafers 200 is charged in the boat 217 (wafer charging), the shutter 219s is moved by the shutter opening/closing mechanism 115s to open the lower end opening of the manifold 209 (shutter opening). Thereafter, as shown in FIG. 2, the boat 217 supporting the wafers 200 is lifted up by the boat elevator 115 and is loaded into the process chamber 201 (boat loading). In this state, the seal cap 219 seals the lower end of the manifold 209 through the O-ring 220b.

(Pressure Regulating and Temperature Adjusting)

The interior of the process chamber 201, namely a space in which the wafers 200 exist, is vacuum-exhausted by the vacuum pump 246 so as to reach a desired pressure (degree of vacuum). In his operation, the internal pressure of the process chamber 201 is measured by the pressure sensor 245. The APC valve 243 is feedback-controlled based on pressure information thus measured (pressure regulating). The vacuum pump 246 is continuously activated at least until the process of the wafers 200 is completed. The interior of the process chamber 201 is heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution (temperature adjusting). In addition, the heating of the interior of the process chamber 201 by the heater 207 is continuously performed at least until the process of the wafers 200 is completed. Subsequently, the rotation of the boat 217 and the wafers 200 by the rotation mechanism 267 begins. The rotation of the boat 217 and the wafers 200 by the rotation mechanism 267 is continuously performed at least until the process of the wafers 200 is completed.

(Film Forming Step)

Thereafter, a precursor gas supply step, a residual gas removal step, a reaction gas supply step and a residual gas removal step are sequentially performed a predetermined number of times.

[Precursor Gas Supply Step]

The valve 314 is opened to allow a TMA gas to flow through the gas supply pipe 310. The flow rate of the TMA gas is adjusted by the MFC 312. The TMA gas is supplied into the process chamber 201 through the depressurization holes 410b formed in the nozzle 410 and then supplied in a depressurized state to the wafers 200 through the gas supply holes 410a. That is to say, the wafers 200 are exposed to the TMA gas. The TMA gas supplied through the supply holes 410a and the depressurization holes 410b is exhausted from the exhaust pipe 231. Simultaneously, the valve 514 is opened to allow as an N$_2$ gas as a carrier gas to flow through the gas supply pipe 510. The flow rate of the N$_2$ gas is adjusted by the MFC 512. The N$_2$ gas is supplied into the process chamber 201 through the supply holes 410a and the depressurization holes 410b of the nozzle 410 together with the TMA gas, and subsequently, is exhausted from the exhaust pipe 231.

Furthermore, in order to prevent the TMA gas from entering the nozzle 420 (in order to prevent backflow), the valve 524 is opened to allow the N$_2$ gas to flow through the gas supply pipe 520. The N$_2$ gas is supplied into the process chamber 201 via the gas supply pipe 520 and the nozzle 420 and subsequently, is exhausted from the exhaust pipe 231.

At this time, the APC valve 243 is appropriately regulated such that the internal pressure of the process chamber 201 is set to fall within a range of, for example, 1 to 1,000 Pa, specifically 1 to 100 Pa, more specifically 10 to 50 Pa. By setting the internal pressure of the process chamber 201 to become 1,000 Pa or less, it is possible to appropriately perform the removal of the residual gas (to be described later). Further, it is possible to suppress the TMA gas from being deposited on the inner wall of the nozzle 410, which is caused by being autolyzed inside the nozzle 410. By setting the internal pressure of the process chamber 201 to become 1 Pa or more, it is possible to increase a reaction rate of the TMA gas on the surface of the wafer 200, thus obtaining a practical deposition rate. In addition, in the present disclosure, in the case of specifying, for example, 1 to 1,000 Pa as a range of a numerical value, it may indicate 1 Pa or more and 1,000 Pa or less. That is to say, the range of the numerical value includes 1 Pa and 1,000 Pa. This holds true with respect to all numerical values described in the present disclosure, such as the flow rate, time period, temperature and the like, other than the pressure.

The supply flow rate of the TMA gas controlled by the MFC 312 may be set at a flow rate which falls within a range of, for example, 10 to 2,000 sccm, specifically 50 to 1,000 sccm, more specifically 100 to 500 sccm. By setting the flow rate of the TMA gas to become 2,000 Pa or less, it is possible to appropriately perform the removal of the residual gas (to be described later) and also to suppress the TMA gas from being deposited on the inner wall of the nozzle 410, which is caused by being autolyzed inside the nozzle 410. By setting the flow rate of the TMA gas to become 10 sccm or more, it is possible to increase a reaction rate of the TMA gas on the surface of the wafer 200, thus obtaining a practical deposition rate.

The supply flow rate of the $N_2$ gas controlled by the MFC 512 may be set at a flow rate which falls within a range of, for example, 1 to 30 slm, specifically 1 to 20 slm, more specifically 1 to 10 slm.

The time period during which the TMA gas is supplied to the wafers 200 may be set at a time period which falls within a range of, for example, 1 to 60 seconds, specifically 1 to 20 seconds, more specifically 2 to 15 seconds.

The heater 207 is heated such that the temperature of the wafers 200 becomes a temperature which falls within a range of, for example, 400 to 600 degrees C., specifically 400 to 550 degrees C., more specifically 450 to 550 degrees C. By setting the temperature of the wafers 200 to become 600 degrees C. or lower, it is possible to properly obtain the deposition rate while suppressing an excessive pyrolysis of the TMA gas and to suppress an increase in resistivity, which is caused by impurities introduced into a film. Furthermore, the pyrolysis of the TMA gas starts at about 450 degrees C. under a condition close to the respective process. Thus, it is more effective to use the present disclosure inside the process chamber 201 heated to a temperature of 550 degrees C. or lower. On the other hand, if the temperature of the wafers 200 is 400 degrees C. or higher, it is possible to obtain the high reactivity and to efficiently form a film.

By supplying the TMA gas into the process chamber 201 under the aforementioned conditions, an Al-containing layer containing C and H and having a thickness of, for example, approximately less than one atomic layer to several atomic layers, is formed on the uppermost surface of the wafer 200. The Al-containing layer containing C and H may include an Al layer containing C and H, an adsorption layer of TMA, or both. The adsorption layer of TMA may include a physical adsorption layer of TMA, a chemical adsorption layer of TMA, or both. Here, the layer having a thickness of less than one atomic layer refers to an atomic layer discontinuously formed, and the layer having a thickness of one atomic layer refers to an atomic layer continuously formed.

(Residual Gas Removing Step)

After the Al-containing layer is formed, the valve 314 is closed to stop the supply of the TMA gas. At this time, the interior of the process chamber 201 is vacuum-exhausted by the vacuum pump 246 while opening the APC valve 243. Thus, the unreacted TMA gas remaining in the process chamber 201 or the TMA gas which remains after contributing to the formation of the Al-containing layer, is removed from the interior of the process chamber 201. Furthermore, the supply of the $N_2$ gas into the process chamber 201 is maintained while opening the valves 514 and 524. The $N_2$ gas acts as a purge gas. This makes it possible to enhance the effect of removing the unreacted TMA gas remaining in the process chamber 201 or the TMA gas which remains after contributing to the formation of the Al-containing layer, from the interior of the process chamber 201. In addition, the $N_2$ gas flowing through the valves 514 and 524 may continuously flow or may be intermittently (in pulses) supplied during the residual gas removal step.

In some embodiments, the gas remaining in the process chamber 201 may not be completely removed and the interior of the process chamber 201 may not be completely purged. If the amount of the gas remaining in the process chamber 201 is small, no adverse effect is generated at a subsequent step. In this case, the flow rate of the inert gas supplied into the process chamber 201 does not need to be large. For example, by supplying the inert gas substantially in the same amount as the volume of the reaction tube 203 (the process chamber 201), it is possible to perform a purge operation such an extent so as not to generate an adverse effect at the subsequent step. By not completely purging the interior of the process chamber 201 in this way, it is possible to shorten the purge time and to improve the throughput. In addition, it is possible to suppress the consumption of the inert gas to a necessary minimum level.

[Reaction Gas Supply Step]

After the residual gas is removed from the interior of the process chamber 201, the valve 324 is opened to allow an $O_3$ gas as a reaction gas to flow through the gas supply pipe 320. The flow rate of the $O_3$ gas is adjusted by the MFC 322. The $O_3$ gas is supplied to the wafers 200 in the process chamber 201 through the supply holes 420a of the nozzle 420 and subsequently, is exhausted from the exhaust pipe 231. That is to say, the wafers 200 is exposed to the $O_3$ gas. At this time, the valve 524 is opened to allow as the $N_2$ gas to flow through the gas supply pipe 520. The flow rate of the $N_2$ gas is adjusted by the MFC 522. The $N_2$ gas is supplied into the process chamber 201 together with the $O_3$ gas and subsequently, is exhausted from the exhaust pipe 231. At this time, in order to prevent the $O_3$ gas from entering the nozzle 410 (in order to prevent backflow), the valve 514 is opened to allow the $N_2$ gas to flow through the gas supply pipe 510. The $N_2$ gas is supplied into the process chamber 201 via the gas supply pipe 510 and the nozzle 410 and subsequently, is exhausted from the exhaust pipe 231.

At this time, the APC valve 243 is, appropriately regulated such that the internal pressure of the process chamber 201 is set to fall within a range of, for example, 1 to 1,000 Pa, specifically 1 to 100 Pa, more specifically 10 to 40 Pa. The supply flow rate of the $O_3$ gas controlled by the MFC 322 may be set at a flow rate which falls within a range of, for example, 5 to 40 slm, specifically 5 to 30 slm, more specifically 10 to 20 slm. The time period during which the $O_3$ gas is supplied to the wafers 200 may be set at a time period which falls within a range of, for example, 1 to 60 seconds, specifically 1 to 30 seconds, more specifically 5 to 25 seconds. Other process conditions may be similar to those of the precursor gas supply step described above.

At this time, the gas flowing into the process chamber 201 is only the $O_3$ gas and the inert gas (the $N_2$ gas). The $O_3$ gas reacts with at least a portion of the Al-containing layer formed on the wafer 200 at the precursor gas supply step. The Al-containing layer is oxidized to, form an aluminum oxide layer (AlO layer) containing Al and O as a metal oxide layer. That is to say, the Al-containing layer is modified to the AlO layer.

(Residual Gas Removal Step)

After the AlO layer is formed, the valve 324 is closed to stop the supply of the O$_3$ gas. Furthermore, the unreacted O$_3$ gas remaining in the process chamber 201 or the O$_3$ gas which remains after contributing to the formation of the AlO layer, is removed from the interior of the process chamber 201 according to the same process procedures as those of the residual gas removal step after the precursor gas supply step. At this time, similar to the residual gas removal step after the precursor gas supply step, the gas or the like remaining in the process chamber 201 may not be completely removed.

[Performing Cycle a Predetermined Number of Times]

A cycle including a sequence of the precursor gas supply step, the residual gas removal step, the reaction gas supply step and the residual gas removal step described above is performed once or more (a predetermined number of times) so that the AlO film is formed on the wafer 200. The number of times of this cycle is properly decided depending on a film thickness required in a finally formed AlO film. However, the cycle may be repeated multiple times. The thickness (film thickness) of the AlO film may be set at a thickness which falls within a range of, for example, 10 to 150 nm, specifically 40 to 100 nm, more specifically 60 to 80 nm. By setting the thickness of the AlO film to become 150 nm or less, it is possible to reduce the surface roughness. In addition, by setting the thickness of the AlO film to become 10 nm or more, it is possible to suppress the occurrence of peeling-off of the AlO film, which is caused by a stress difference between the AlO film and the underlying film.

(After-Purging and Atmospheric Pressure Returning)

Upon the film forming step is completed, the valves 514 and 524 are opened such that the N$_2$ gas is supplied from the gas supply pipes 310 and 320 into the process chamber 201. Subsequently, the N$_2$ gas is exhausted from the exhaust pipe 231. The N$_2$ gas acts a purge gas such that the gas or the byproduct remaining in the process chamber 201 is removed from the interior of the process chamber 201 (after-purging). Thereafter, the internal atmosphere of the process chamber 201 is substituted with the N$_2$ gas (N$_2$ gas substituting). The internal pressure of the process chamber 201 is returned to atmospheric pressure (atmospheric pressure returning).

(Boat Unloading and Wafer Discharging)

Thereafter, the seal cap 219 is moved down by the boat elevator 115 to open the lower end of the manifold 209. The processed wafers 200 supported by the boat 217 are unloaded from the lower end of the manifold 209 outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded from the reaction tube 203 and subsequently discharged from the boat 217 (wafer discharging).

(4) Effects According to the Present Embodiment

According to the aforementioned embodiment, one or more effects as set fort below may be achieved.

(a) As described above, the plurality of supply holes 410a is formed at the upper portion (a height corresponding to the stack area of the wafers 200) of the nozzle 410 configured to supply the TMA gas, and the depressurization holes 410b is formed at the lower portion (in the vicinity of the boundary of the soaking field of the heater 207, a position where the internal temperature of the nozzle 410 is lower than a predetermined temperature, a portion below the product substrate, and a portion onto which gas deposits adhere when the depressurization holes 410b are not formed) of the nozzle 410. This makes it possible to reduce the internal pressure of the nozzle 410 to suppress the pyrolysis of a gas within the nozzle 410, thus suppressing the generation of the gas deposits, which causes the blackening of the inner wall of the nozzle 410. Furthermore, it is possible to suppress the generation of panicles which is caused by the blackening of the inner wall of the nozzle 410.

(b) By representing the product of the internal temperature, internal pressure, and gas density of the nozzle 410 by a ratio to index a blackening risk and optimizing the balance (a ratio of total aperture area values, a flow rate balance or the like) between the supply holes through which a gas is supplied to the substrate and the depressurization holes such that it falls within a non-blackening range (such that is a value with which the TMA gas does not adhere onto the interior of the nozzle 410), it is possible to suppress the adhesion of the gas deposits onto the inner wall of the nozzle 410 and to enhance the inter-plane uniformity of films formed on the stacked substrates.

(c) By forming the hole diameters (aperture areas) of the plurality of supply holes 410a to be gradually increased from the upstream side of the nozzle 410 toward the downstream side thereof, it is possible to further uniformize the flow rate of the gas supplied from the supply holes 420a and to enhance the inter-plane film thickness uniformity of the AlO films formed on the plurality of wafers 200.

(d) By optimizing the balance between the supply holes and the depressurization holes, it is possible to adjust (control or tune) the supply flow rate of the TMA gas in each stack area (each zone) of the stacked wafers 200 using a single nozzle. Thus, it is possible to enhance the productivity by effectively utilizing an empty space, in preparation for, for example, the installation of a preliminary nozzle or an additional nozzle for supplying other gases.

(5) Other Embodiments

The shape of the nozzle 410, and the positions, the hole diameter, the aperture area and the like of the supply holes and the depressurization holes are not limited to those shown in FIG. 4 according to the first embodiment but may be modified as in, for example, the following embodiments as long as the balance (the ratio of total aperture area values or the like) between the supply holes and the depressurization holes can be optimized to fall within a non-blackening range illustrated in FIG. 1. Hereinafter, descriptions differing from the first embodiment will be mainly given. Even in the following embodiments, at least one or more effects mentioned above may be achieved.

Second Embodiment

Figure 7:
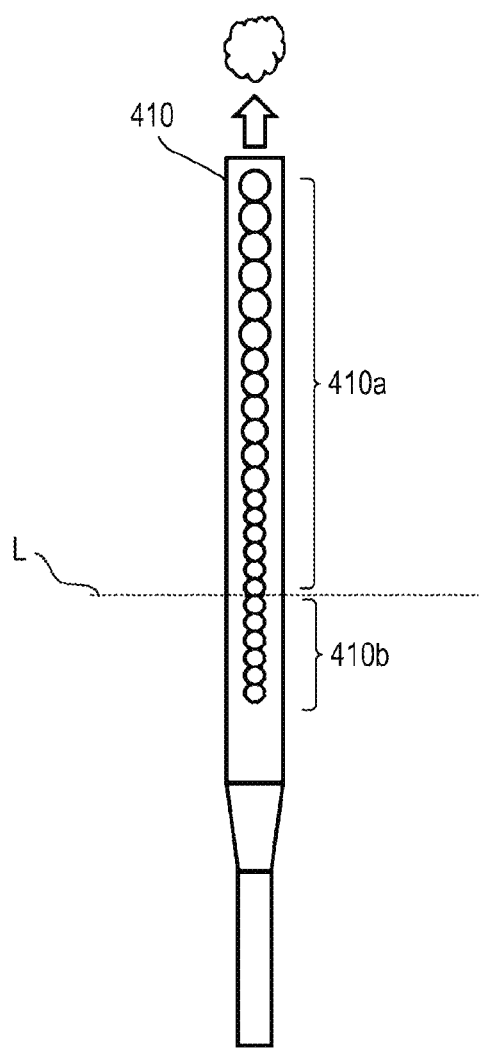
FIG. 7 is a view illustrating a nozzle for supplying a precursor gas in a second embodiment of the present disclosure.

As illustrated in FIG. 7, the uppermost portion of the nozzle 410 may be opened upward. By opening the uppermost portion of the nozzle 410 upward, it is possible to increase an aperture area in the upper portion and to further supply a larger amount of precursor gas to a portion of an upper layer of each of the stacked wafers 200

Third Embodiment

Figure 8:
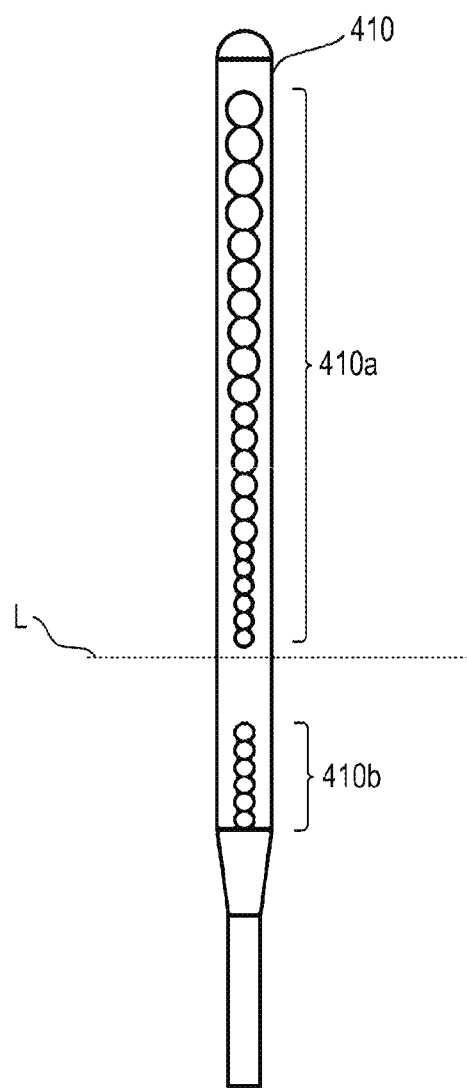
FIG. 8 is a view illustrating a nozzle for supplying a precursor gas in a third embodiment of the present disclosure.

As illustrated in FIG. 8, the depressurization holes 410b may be formed in the lower portion of the nozzle 410, for example, below the broken line L corresponding to the lower end of the heater 207. The supply holes 410*a* may be formed in the upper portion of the nozzle 410, for example, above the broken line L. A distance between the supply holes 410*a* and the depressurization holes 410*b* is set to be greater than at least a hole diameter of the supply hole 410*a* positioned at the lowermost stage. For example, the distance between the supply holes 410*a* and the depressurization holes 410*b* may be set to become several times the hole diameter of the lowermost supply hole 410*a*.

Fourth Embodiment

Figure 9:
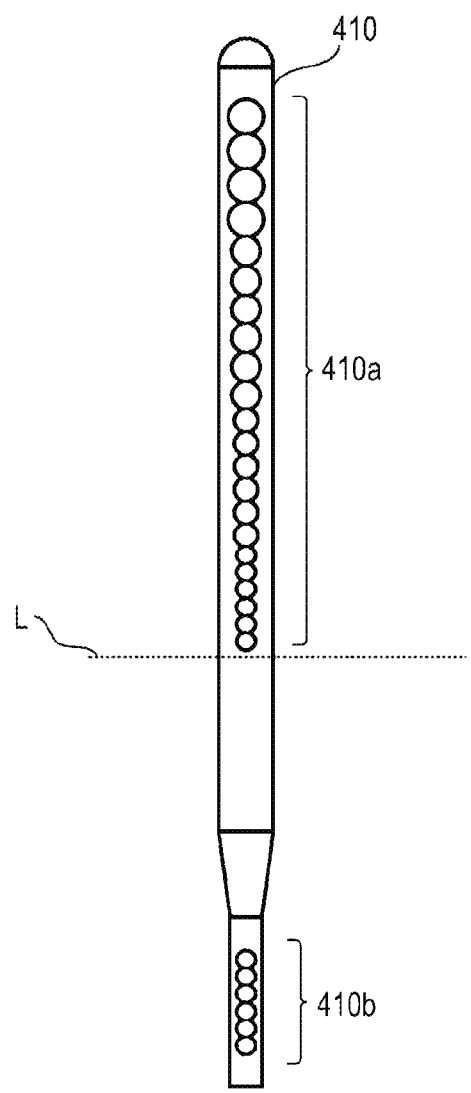
FIG. 9 is a view illustrating a nozzle for supplying a precursor gas in a fourth embodiment of the present disclosure.

As illustrated in FIG. 9, the depressurization holes 410*b* may be formed in the lower portion of the nozzle 410, for example, in the most upstream side of the vertical portion of the nozzle 410, which is further below the broken line L corresponding to the lower end of the heater 207. The supply holes 410*a* may be formed in the upper portion of the nozzle 410, for example, above the broken line L. A distance between the supply holes 410*a* and the depressurization holes 410*b* is set to become several times at least the hole diameter of the lowermost supply hole 410*a*. For example, the depressurization holes 410*b* may be formed at a height corresponding to a heat insulating plate (not shown) or the heat insulating tube 218.

Fifth Embodiment

Figure 10:
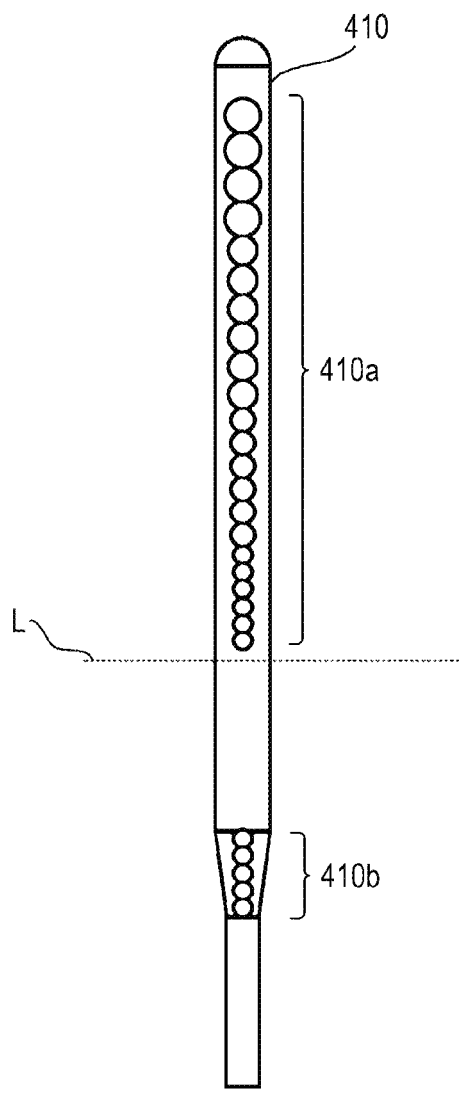
FIG. 10 is a view illustrating a nozzle for supplying a precursor gas in a fifth embodiment of the present disclosure.

As illustrated in FIG. 10, the depressurization holes 410*b* may be formed in the lower portion of the nozzle 410, for example, in the most upstream side of the vertical portion of the nozzle 410, which is further below the broken line L corresponding to the lower end of the heater 207. The supply holes 410*a* may be formed in the upper portion of the nozzle 410, for example, above the broken line L. A distance between the supply holes 410*a* and the depressurization holes 410*b* is set to become several times at least the hole diameter of the lowermost supply hole 410*a*.

Sixth Embodiment

Figure 11:
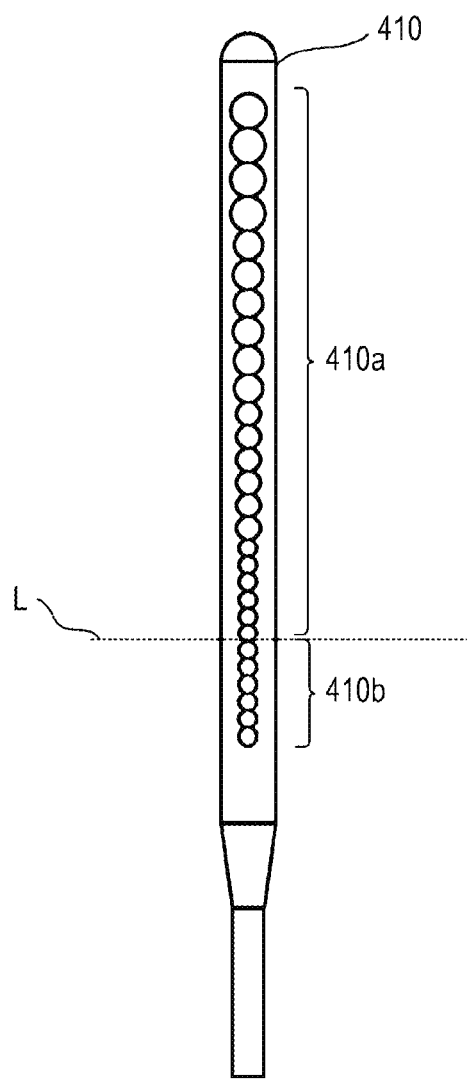
FIG. 11 is a view illustrating a nozzle for supplying a precursor gas in a sixth embodiment of the present disclosure.

As illustrated in FIG. 11, the depressurization holes 410*b* may be formed in the lower portion of the nozzle 410, for example, below the broken line L corresponding to the lower end of the heater 207. The supply holes 410*a* may be formed in the upper portion of the nozzle 410, for example, above the broken line L.

Seventh Embodiment

Figure 12:
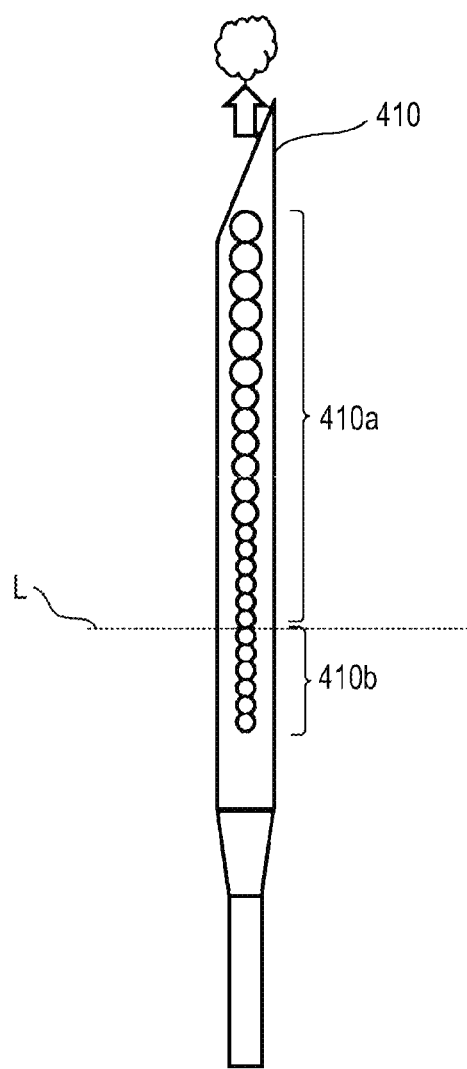
FIG. 12 is a view illustrating a nozzle for supplying a precursor gas in a seventh embodiment of the present disclosure.

As illustrated in FIG. 12, the uppermost portion of the nozzle 410 may be obliquely opened. A direction in which the uppermost portion is obliquely opened is optimized in consideration of influence on the wafers 200 (influence on film formation). By obliquely forming the uppermost portion of the nozzle 410, it is possible to increase an aperture area at the upper portion and to further supply a larger amount of precursor gas to a portion of an upper layer of each of the stacked wafers 200. Moreover, by changing an aperture angle, it is possible to adjust the aperture area (the cross sectional area of the nozzle 410) depending on a required flow rate of a precursor gas.

Eighth Embodiment

Figure 13:
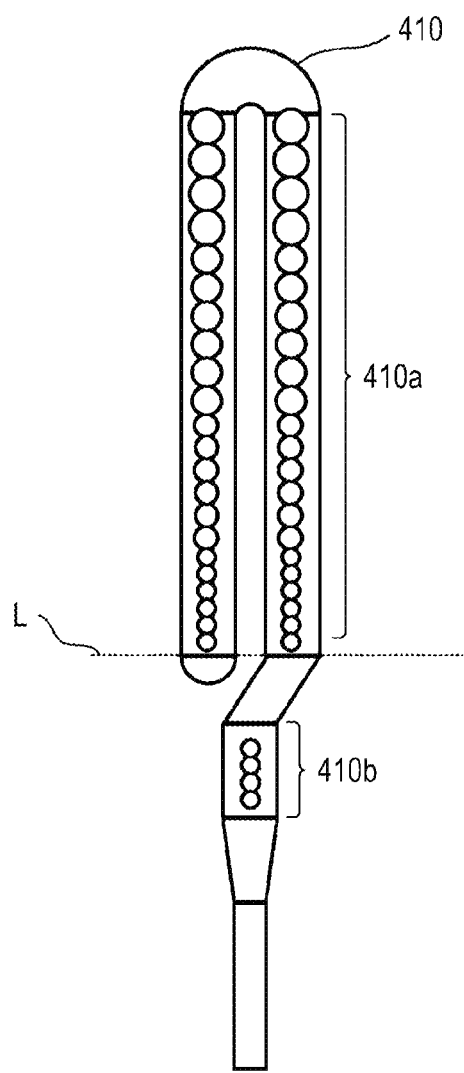
FIG. 13 is a view illustrating a nozzle for supplying a precursor gas in an eighth embodiment of the present disclosure.

As illustrated in FIG. 13, the nozzle 410 may be bent in a U-formation in the middle of the nozzle 410. The depressurization holes 410*b* may be formed in the lower portion (upstream side) of the nozzle 410, for example, above the most upstream side of the vertical portion of the nozzle 410, which is further below the broken line L corresponding to the lower end of the heater 207. The supply holes 410*a* may be formed in the upper portion of the nozzle 410, for example, above the broken line L (at the downstream side of the vertical portion of the nozzle 410). Hole diameters of the supply holes 410*a* are gradually increased such that aperture areas of the supply notes 410*a* are gradually increased toward the upper portion of the nozzle 410. That is to say, the hole diameters of the supply holes 410*a* are gradually increased as they go from the upstream side of the nozzle 410 to a folded portion of the U-formation, and is gradually reduced as it goes from the folded portion of the U-formation to the front end (downstream side) of the nozzle 410.

Ninth Embodiment

Figure 14:
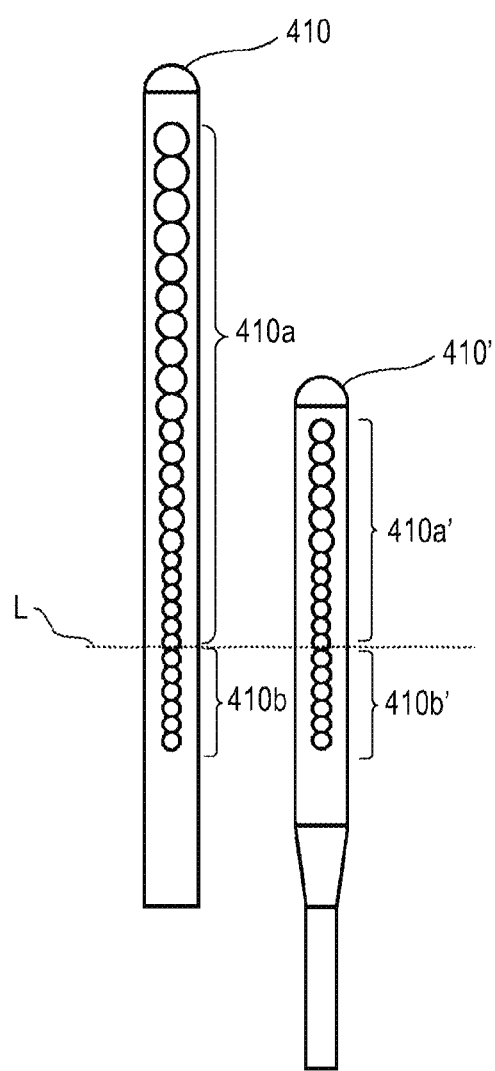
FIG. 14 is a view illustrating a nozzle for supplying a precursor gas in a ninth embodiment of the present disclosure.

As illustrated in FIG. 14, a nozzle (head-lowered nozzle) 410' shorter in length than the nozzle 410 may be additionally used such that a TMA gas is supplied from two nozzles 410 and 410' having different lengths.

Depressurization holes 410*b* and 410*b*' are respectively formed in upper portions of the nozzles 410 and 410', for example, below the broken line L corresponding to the lower end of the heater 207. Supply holes 410*a* and 410*a*' are respectively formed in upper portions of the nozzles 410 and 410', for example, above the broken line L. Hole diameters of the supply holes 410*a* and 410*a*' are gradually increased such that aperture areas of the supply holes 410*a* and 410*a*' are gradually increased as they go from the upstream sides of the nozzles 410 and 410' to the downstream sides thereof. In this embodiment, an example in which the depressurization holes 410*b* and 410*b*' are formed at the same height and to have the same hole diameter, and in the same number is illustrated. That is to say, the depressurization holes 410*b* and 410*b*' in the nozzles 410 and 410' are equal in the total aperture area to one another. The present disclosure is not limited thereto. In some embodiments, the total aperture areas of the depressurization holes 410*b* and 410*b*' may be optimized depending on a length of the respective nozzles 410 and 410'. Furthermore, in FIG. 14, the shape in which the uppermost portion of the nozzle 410' is closed is illustrated as an example. The present disclosure is not limited thereto but the uppermost portion of the nozzle 410' may be opened upward. The supply holes 410*a*' may not be formed in the sidewall of the nozzle 410. For example, a single supply hole 410*a*' may be formed to be opened upward, according to a supply balance of a precursor gas between the nozzles 410 and 410'.

Tenth Embodiment

FIG. 15A illustrates the nozzle 410 according to the second embodiment as a comparative example and FIG. 15B illustrates a nozzle 410' according to this embodiment. As illustrated in FIG. 15B, the hole diameter of the supply holes 410*a*' may be set smaller than that of the depressurization holes 410*b*'. Further, the hole diameters of the supply holes 410*a*' may be set equal to each other. By changing the number of the respective supply holes 410*a*, a flow rate of a precursor gas supplied from the supply holes 410*a*' at respective heights may be set equal to that of a precursor gas supplied from the supply holes 410*a* of the nozzle 410. The number of the respective supply boles 410*a* may be gradually increased from the upstream side of the nozzle 410' toward the downstream thereof such that the supply holes 410a have aperture areas gradually increasing from the upstream side of the nozzle 410' toward the downstream side thereof and the aperture areas of the supply holes 410a' are equal to those of the supply holes 410a (the flow rates of a precursor gas supplied) at the respective heights. Furthermore, after a film is formed on each of the wafers 200, the interior of the process chamber 201 may be cleaned with gas. From the viewpoint of cleaning, the hole diameter of the nozzle may set to be small. While in this embodiment, the second embodiment has been described as a comparative example, the present disclosure is not limited thereto but any other embodiment may be similarly applied. While the depressurization holes 410b' have been described to have the same shape as those of the second embodiment, the present disclosure is not limited thereto but may have the shape of any other embodiment.

Eleventh Embodiment

As illustrated in FIGS. 16A and 16B, in a case where a large amount of precursor gas is supplied to the central portion of the stacked wafers 200, aperture areas of the supply holes 410a and 410a' formed near the center portions of the nozzles 410 and 410' may be set to have a relatively large size. The aperture areas of the supply holes 410a and 410a' are gradually increased up to the vicinity of the respective center portions from the upstream sides of the nozzle 410 and 410' toward the downstream sides thereof, and subsequently, is gradually reduced from the vicinity of the respective center portions toward the further downstream sides. The balance between the aperture areas in a vertical direction may be appropriately changed depending on a flow rate of a precursor gas required at a respective height of each nozzle. In the nozzle 410, the supply holes 410a are formed one per each height in a vertical direction, and the aperture area at each height is adjusted by changing a hole diameter of the respective supply hole 410a. Each of the supply holes 410a' has a hole diameter smaller than that of each of the depressurization holes 410b', and the hole diameters of the supply holes 410a' are equal to each other. In this state, the aperture area at each height may be adjusted by changing the number of respective holes. While the depressurization holes 410b and 410b' has been described to have the same shape as that of the second embodiment as an example, the present disclosure is not limited thereto but may have the shape of other embodiments.

Twelfth Embodiment

As illustrated in FIGS. 17A and 17B, in a case where a large amount of precursor gas is supplied to the lower portion (bottom portion) of the stacked wafers 200, aperture areas of the supply holes 410a and 410a' formed near the lower portions of the nozzles 410 and 410' may be increased. The aperture areas of the supply holes 410a and 410a' are gradually reduced from the upstream side of the nozzles 410 and 410' toward the downstream side thereof. The balance between the aperture areas in a vertical direction may be appropriately changed depending on a flow rate of a precursor gas required at a respective height of each nozzle. In the nozzle 410, the supply holes 410a are formed one per each height in the vertical direction, and the aperture area at each height may be adjusted by changing a hole diameter of the respective hole. Each of the supply holes 410a' has a hole diameter smaller than that of the depressurization holes 410b', and the hole diameters of the supply holes 410a' are equal to each other. In this state, the aperture area at each height may be adjusted by changing the number of respective holes.

As described above, the supply holes 410a and 410a' may be appropriately adjusted to have the hole diameter and the number of holes so as to obtain a desired gas flow rate, in consideration of the balance of the gas flow rate.

The embodiments of the present disclosure have been concretely described above. The present disclosure is not limited to the aforementioned embodiments but may be differently modified without departing from the spirit of the present disclosure.

For example, in the aforementioned embodiments, there has been described an example in which a TMA gas is used as the Al-containing gas. However, the present disclosure is not limited thereto. For example, aluminum chloride ($AlCl_3$) or the like may be used as the Al-containing gas. Furthermore, there has been described an example in which an $O_3$ gas is used as the O-containing gas. However, the present disclosure is not limited thereto. For example, oxygen ($O_2$) water ($H_2O$), hydrogen peroxide ($H_2O_2$), a combination of $O_2$ plasma and hydrogen ($H_2$) plasma may be applied. In addition, there has been described an example in which an $N_2$ gas is used as the inert gas. The present disclosure is not limited thereto but a rare gas such as an Ar gas, an He gas, an Ne gas, a Xe gas or the like may be used as the inert gas.

Furthermore, in the aforementioned embodiments, there has been described an example in which an AlO film is formed on the substrate. However, the present disclosure is not limited thereto. For example, the present disclosure is effective for a film having an adhesion, in which the film is autolyzed inside a nozzle at a process temperature, thereby generating the gas deposits adhering onto an inner wall of the nozzle, and the gas deposits are peeled off during a film deposition cycle. In addition, the present disclosure may be used for a type of film which is formed by supplying a precursor gas while diluting the precursor gas with an inert gas or the like. Such a film contains elements such as titanium (Ti), zirconium (Zr), hafnium (Hf), tantalum (Ta), niobium (Nb), molybdenum (Mo), Tungsten (W), yttrium (Y), lanthanum (La), strontium (Sr), and silicon (Si). Moreover, the present disclosure may be applied to a nitride film, a carbonitride film, an oxide film, an oxycarbide film, an oxynitride film, an oxycarbonitride film, a boron nitride film, a boron carbonitride film, a film composed of only metal element or the like, which contains at least one of the above elements.

Recipes (programs specifying process procedures and process conditions) used in the film forming process may be prepared individually according to process contents (the kind, composition ratio, quality, film thickness, process procedure and process condition of a film as formed or removed) and may be stored in the memory device 121c via a telecommunication line or the external memory device 123. Moreover, at the start of the film forming process, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility, and to perform a process adapted for a respective case. In addition, it is possible to reduce an operator's burden (e.g., a burden borne by an operator when inputting process procedures and process conditions) and to quickly start a substrate process while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

The embodiments described above may be appropriately combined with one another. In addition, process conditions applied at this time may be similar to, for example, the process conditions of the embodiments described above.

According to the present disclosure in some embodiments, it is possible to enhance a film quality and an in-plane film thickness uniformity of substrates while enhancing an inter-plane film thickness uniformity of the substrates.

While certain embodiments have been described, these embodiments have been presented by way of example only, and are not intended to limit the scope of the disclosures. Indeed, the apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or the modification as would fall within the scope and spirit of the disclosures.

What is claimed is:

1. A substrate processing apparatus, comprising:
a process chamber including a boat, which is installed in the process chamber and configured to accommodate a plurality of substrates to be stacked therein;
a heating system configured to heat the process chamber to a predetermined temperature;
a precursor gas supply system including a precursor gas nozzle, and configured to supply a precursor gas from the precursor gas nozzle to the process chamber, wherein the precursor gas nozzle is installed to extend along a direction in which the plurality of substrates is stacked in the boat, wherein a plurality of holes formed on the precursor gas nozzle consists of: a plurality of supply holes formed above a lower end of the boat and a plurality of depressurization holes formed below the lower end of the boat, wherein an internal pressure of the precursor gas nozzle is reduced through the plurality of depressurization holes, and wherein aperture areas of the plurality of depressurization holes are each configured to be greater than an aperture area of a supply hole, which is the most adjacent to the plurality of depressurization holes, among the plurality of supply holes;
a reaction gas supply system configured to supply a reaction gas reacting with the precursor gas in the process chamber; and
a controller configured to control the heating system, the precursor gas supply system and the reaction gas supply system to form a film on each of the plurality of substrates by performing a process, while heating the process chamber accommodating the plurality of substrates to the predetermined temperature, the process including;
supplying the precursor gas from the precursor gas nozzle to the process chamber; and
supplying the reaction gas to the process chamber.

2. The apparatus of claim 1, wherein respective total aperture area values of the plurality of supply holes and the plurality of depressurization holes and a ratio between the total aperture area value of the plurality of supply holes and the total aperture area value of the plurality of depressurization holes are set such that a product of the internal temperature and the internal pressure of the precursor gas nozzle has a value with which the precursor gas is not autolyzed inside the precursor gas nozzle.

3. The apparatus of claim 1, wherein aperture areas of the plurality of supply holes gradually increase from an upstream side of the precursor gas nozzle toward a downstream side of the precursor gas nozzle.

4. The apparatus of claim 1, wherein each of the plurality of depressurization holes has the same aperture area.

5. The apparatus of claim 1, wherein a distance between a lowermost supply hole among the plurality of supply holes and an uppermost depressurization hole among the plurality of depressurization holes is greater than a hole diameter of the lowermost supply hole.

6. The apparatus of claim 1, wherein an uppermost portion of the precursor gas nozzle opens upward.

7. The apparatus of claim 6, wherein the uppermost portion of the precursor gas nozzle obliquely opens.

8. The apparatus of claim 1, wherein the precursor gas is an organic-based precursor and the predetermined temperature falls within a range of 400 to 600 degrees C.

9. The apparatus of claim 1, wherein an uppermost depressurization hole among the plurality of depressurization holes is positioned such that a distance between the uppermost depressurization hole and a lowermost supply hole among the plurality of supply holes is greater than a hole diameter of the lowermost supply hole.

10. A precursor gas nozzle, which is installed to extend along a direction in which a plurality of substrates is stacked in a boat installed in a process chamber,
wherein a plurality of holes formed on the precursor gas nozzle consists of:
a plurality of supply holes formed above a lower end of the boat; and
a plurality of depressurization holes formed below the lower end of the boat,
wherein an internal pressure of the precursor gas nozzle is reduced through the plurality of depressurization holes, and
wherein aperture areas of the plurality of depressurization holes are each configured to be greater than an aperture area of a supply hole, which is the most adjacent to the plurality of depressurization holes, among of the plurality of supply holes.

* * * * *